United States Patent
Kinlen

(10) Patent No.: US 12,065,585 B2
(45) Date of Patent: Aug. 20, 2024

(54) STATIC DISSIPATING COATINGS, ELECTRONIC CIRCUITS COMPRISING SUCH COATINGS, AND METHODS OF FORMING SUCH COATINGS AND CIRCUITS

(71) Applicant: The Boeing Company, Chicago, IL (US)

(72) Inventor: Patrick John Kinlen, Fenton, MO (US)

(73) Assignee: The Boeing Company, Chicago, IL (US)

( * ) Notice: Subject to any disclaimer, the term of this patent is extended or adjusted under 35 U.S.C. 154(b) by 257 days.

(21) Appl. No.: 17/473,488

(22) Filed: Sep. 13, 2021

(65) Prior Publication Data

US 2022/0135811 A1 May 5, 2022

Related U.S. Application Data

(60) Provisional application No. 63/107,108, filed on Oct. 29, 2020.

(51) Int. Cl.
  *C09D 5/24* (2006.01)
  *C09D 7/20* (2018.01)
  (Continued)

(52) U.S. Cl.
  CPC ............... *C09D 5/24* (2013.01); *C09D 7/20* (2018.01); *C09D 7/48* (2018.01); *C09D 7/63* (2018.01);
  (Continued)

(58) Field of Classification Search
  CPC . H01B 1/00; H01B 1/128; H01B 1/20; C09D 5/24; H05K 3/28; H01L 23/60
  See application file for complete search history.

(56) References Cited

U.S. PATENT DOCUMENTS 5,840,214 A * 11/1998 Kinlen ............... H01B 1/128
                                                      427/337
5,962,148 A * 10/1999 Nishimura ............ C09D 5/24
                                                      252/519.12
(Continued)

FOREIGN PATENT DOCUMENTS

EP       3372633  A2   9/2018
KR     100430989  B1   5/2004

OTHER PUBLICATIONS

KR 1020020094770 (pub date Dec. 2002) English language machine translation.*

(Continued)

*Primary Examiner* — Mark Kopec
(74) *Attorney, Agent, or Firm* — Jordan IP Law, LLC

(57) ABSTRACT

Described herein are static dissipating coatings and thermally-stable static-controlled (TSSC) electronic circuits, comprising such coatings. Also described herein are methods of forming such coatings and circuits. In some examples, a static dissipating coating comprises a conductive polymer and a thermally-stable base polymer. The conductive polymer comprises polyaniline and, in some examples, a conductive agent, such as dinonylnaphthalene sulfonic acid (DNNSA), dodecyl benzene sulfonic acid (DBSA), and/or camphor sulfonic acid (CSA). The thermally-stable base polymer comprises one or more copolymers of butyl-methacrylate, such as poly-butylmethacrylate-co-methyl methacrylate (PBM). The amount of the conductive polymer is specifically controlled to ensure the coating's overall conductivity and thermal stability. In some examples, the conductive polymer concentration is at or less than 25% by weight. The conductivity of the coating is between $10^{-9}$ S/cm and $10^{-6}$ S/cm even after being exposed to 150° C. for up to 24 hours.

20 Claims, 7 Drawing Sheets

(51) Int. Cl.
*C09D 7/48* (2018.01)
*C09D 7/63* (2018.01)
*C09D 179/02* (2006.01)
*H01B 1/00* (2006.01)
*H01B 1/12* (2006.01)
*H05K 3/28* (2006.01)
*H05K 9/00* (2006.01)

(52) U.S. Cl.
CPC .......... *C09D 179/02* (2013.01); *H01B 1/128* (2013.01); *H05K 3/284* (2013.01); *H05K 3/285* (2013.01); *H05K 9/0079* (2013.01)

(56) References Cited

U.S. PATENT DOCUMENTS

| | | | |
|---|---|---|---|
| 6,099,757 A | 8/2000 | Kulkarni | |
| 6,254,996 B1 * | 7/2001 | Fukuda | C08J 7/044 428/480 |
| 6,482,521 B1 | 11/2002 | Lee et al. | |
| 9,753,291 B2 * | 9/2017 | Jun | G02B 1/16 |
| 10,032,945 B2 * | 7/2018 | Mu | H01L 31/022425 |
| 10,182,497 B1 | 1/2019 | Wang | |

OTHER PUBLICATIONS

Del Castillo-Castro et al "Electrical, mechanical and piezo-resistive behavior of a polyaniline/poly(n-butyl methacrylate) composite", Composites: Part A 40 (2009) 1573-1579.*

Wu et al "Enhanced electrical conductivity and competent mechanical properties of polyaniline/polyacrylate (PANI/PA) composites for antistatic finishing prepared at the aid of polymeric stabilizer", Process in Organic Coatings 125 (2018) 99-108.*

Kwon et al "Preparation and Properties of Waterborne-Polyurethane Coating Materials Containing Conductive Polyaniline", Macromolecular Research, vol. 12, No. 3, pp. 303-310 (2004).*

European Application Serial No. 21204452.3, Search Report dated Mar. 28, 2022, 6 pages.

* cited by examiner

STATIC DISSIPATING COATINGS, ELECTRONIC CIRCUITS COMPRISING SUCH COATINGS, AND METHODS OF FORMING SUCH COATINGS AND CIRCUITS

CROSS-REFERENCE TO RELATED APPLICATIONS

This application claims the benefit under 35 U.S.C. § 119(e) of U.S. Provisional Patent Application 63/107,108, filed on 2020 Oct. 29, which is incorporated herein by reference in its entirety for all purposes.

BACKGROUND

A typical electronic circuit comprises multiple electronic devices, which are densely packaged on a base structure. Such circuits are used for various applications such as aircraft 15 and spacecraft. Some applications require an encapsulation of these electronic devices to prevent direct contact with the environment (e.g., humidity). Furthermore, special conductive layers are used for static dissipation within the circuit thereby preventing the accumulation of electronic charge on the devices. For example, spacecraft applications can subject electronic circuits to solar winds and other sources of electron fluxes, which can cause substantial charge 20 buildups if not addressed. As such, surface layers need to have sufficient electronic conductivity to allow for charge dissipation without shorting the devices. Conventional conductive coatings, used for static control, typically include metal fillers or other solid conductive fillers, distributed within non-conductive bases. However, such filler-based coatings have some drawbacks. First, the conductivity of such coatings is often not sufficiently uniform, which results in high-conductivity pockets (e.g., formed by larger filler particles, particle agglomerates) and potential electrical shorts. At the same time, other areas of the coating suffer from low conductivity and insufficient static dissipation. Furthermore, solid fillers alter mechanical properties of encapsulation layers (e.g., reducing flexibility, transparency), which may not be desirable.

SUMMARY

Described herein are static dissipating coatings and thermally-stable static-controlled (TSSC) electronic circuits, comprising such coatings. Also described herein are methods of forming such coatings and circuits. In some examples, a static dissipating coating comprises a conductive polymer and a thermally-stable base polymer. The conductive polymer comprises polyaniline and, in some examples, a conductive agent, such as dinonylnaphthalene sulfonic acid (DNNSA), dodecyl benzene sulfonic acid (DBSA), and/or camphor sulfonic acid (CSA). The thermally-stable base polymer comprises one or more copolymers of butyl-methacrylate, such as poly-butylmethacrylate-co-methyl methacrylate (PBM). The amount of the conductive polymer is specifically controlled to ensure the coating's overall conductivity and thermal stability. In some examples, the conductive polymer concentration is at or less than 25% by weight. The conductivity of the coating is between $10^{-9}$ S/cm and $10^{-6}$ S/cm even after being exposed to 150° C. for up to 24 hours.

In some examples, a thermally-stable static-controlled electronic circuit comprises a base structure, electronic components, disposed on and supported by the base structure, and a static dissipating coating, conformally covering the base structure and each of the electronic components. The static dissipating coating comprises a conductive polymer and a thermally-stable base polymer. The conductive polymer comprises polyaniline. The thermally-stable base polymer comprises one or more copolymers of butyl-methacrylate.

In some examples, a static dissipating coating is used for conformal coating over electronic components. The static dissipating coating comprises a conductive polymer, comprising polyaniline, and a thermally-stable base polymer, comprising one or more copolymers of butyl-methacrylate.

In some examples, a method of forming a thermally-stable static-controlled electronic circuit comprises providing a conductive polymer and a thermally-stable base polymer. The conductive polymer comprises one or more polyanilines. The thermally-stable base polymer comprises one or more copolymers of butyl-methacrylate. The method further comprises forming a static dissipating ink using a solvent, the conductive polymer, and the thermally-stable base polymer. The method then proceeds with forming a static dissipating coating using the static dissipating ink. The static dissipating coating is formed over a base structure with electronic components disposed on and supported by the base structure such that the static dissipating coating conformally covers the base structure and each of the electronic components and providing static dissipation to the electronic components while preventing electrical shorts among the electronic components.

DETAILED DESCRIPTION

Figure 1:
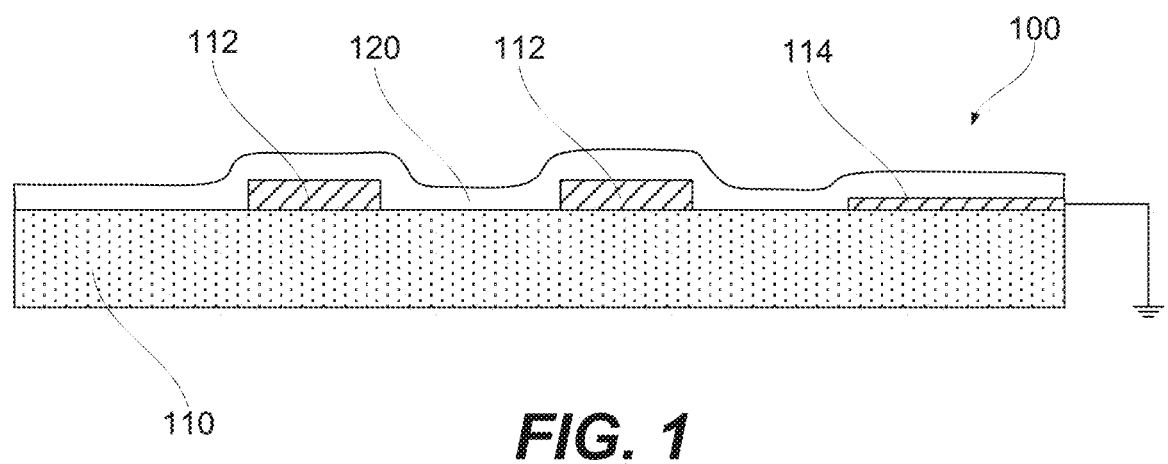
FIG. 1 is a schematic illustration of a TSSC electronic circuit, comprising a static dissipating coating, in accordance with some examples.

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with the specific examples, it will be understood that these examples are not intended to be limiting.

INTRODUCTION

As noted above, static charge dissipation is desired for many circuit types and applications, such as aircraft and spacecraft applications. While conductive coating can provide this static control function, many conventional coatings lack uniform conductivity (e.g., filler-based coatings) or are not thermally stable (e.g., polyurethane-based coating). Both characteristics are desired. For example, the uniform conductivity ensures that the static charge dissipation happens in substantially all portions of the coating (e.g., all portions have a sufficiently high conductivity) without causing any electrical shorts among electronic components (e.g., by coating portions with excessive conductivities). For purposes of this disclosure, uniform conductivity is defined as a conductivity that varies less than 100 times or less than 10 times through the entire volume of the coating. Furthermore, the thermal stability of static dissipating coatings is particularly desired in dense electronic circuits (e.g., with significant thermal output) and/or applications with temperature fluctuations (e.g., aircraft and spacecraft). For purposes of this disclosure, thermal stability is defined as a conductivity change of less than 100 times or less than 10 times when exposed to 150° C. for at least 24 hours.

Described herein are static dissipating coatings and thermally-stable static-controlled (TSSC) electronic circuits, comprising such coatings. These static dissipating coatings are configured to be thermally stable and maintain their resistance within an operating range while being exposed to elevated temperatures. This performance is not possible with conventional polyurethane-based coatings. This thermal stability of the described coatings is achieved by a specific combination of materials for static dissipating coatings. For example, a static dissipating coating comprises a specific combination of a conductive polymer and a thermally-stable base polymer. The thermally-stable base polymer comprises one or more copolymers of butyl-methacrylate, such as poly-butylmethacrylate-co-methyl methacrylate (PBM). The PBM has high thermal stability (up to 337° C.) and is soluble in a range of aromatic solvents (e.g., up to 25% by weight in cymene). In some examples, the thermally-stable base polymer has a solubility of between about 1% and 25% by weight, between about 5% and 25% by weight, and between about 10% and 25% by weight in one or more solvents used to form a static dissipating ink. For purposes of this disclosure, solubility is defined as a lack of particle precipitation in a solution at a stated concentration. PBM's thermal stability allows increasing the thermal stability of the static dissipating coating. At the same time, PBM's solubility allows integrating PBM with other polymers, such as polyaniline, to achieve the desired conductivity of the static dissipating coating. A combination of the desired conductivity and thermal stability is achieved by a specific formulation of the static dissipating coating, e.g., specific weight ratios of the conductive polymer and the thermally-stable base polymer. Furthermore, the performance uniformity of the static dissipating coating is achieved by specific methods of forming this coating, e.g., first forming a solution of the conductive polymer and the thermally-stable base polymer and then casting or otherwise depositing this solution onto the base structure and electronic components of the TSSC electronic circuit.

Examples of Thermally-Stable Static-Controlled Electronic Circuits

FIG. 1 is a schematic illustration of TSSC electronic circuit 100, in accordance with some examples. TSSC electronic circuit 100 can be used for various applications, such as aircraft and spacecraft. For example, spacecraft applications present unique challenges due to the lack of atmosphere around TSSC electronic circuit 100. Without proper static measures, a static charge can accumulate and cause static charge dissipations, which are potentially damaging to various circuit components. On aircraft, precipitation static (P-stat) can cause charge build-up on the aircraft surfaces during flight, which can also lead to static build-up on electronic components.

TSSC electronic circuit 100 comprises base structure 110, electronic components 112, and static dissipating coating 120. Static dissipating coating 120 conformally covers base structure 110 and each of electronic components 112. Furthermore, static dissipating coating 120 provides static dissipation to electronic components 112 over a wide temperature range, for example, temperatures of from about −250° C. to about +250° C. or, more specifically, from about −50° C. to about +150° C. At the same time, static dissipating coating 120 prevents electrical shorts between electronic components 112. These characteristics are achieved by maintaining the resistance within a set operating range and the resistance being uniform throughout static dissipating coating 120 as further described below.

Some examples of base structure 110 include, but are not limited to, a printed circuit board and a flexible circuit. Electronic components 112 are disposed on and supported by base structure 110. For example, electronic components 112 are surface mounted to base structure 110 using, e.g., an adhesive. Electronic components 112 are interconnected using, e.g., conductive leads of base structure 110. Some examples of electronic components 112 include, but are not limited to, resistors, capacitors, power sources, memory components, and the like.

In some examples, TSSC electronic circuit 100 further comprises ground contact 114, disposed on and supported by base structure 110. Ground contact 114 is electrically insulated from electronic components 112. Static dissipating coating 120 conformally covers ground contact 114 and provides static dissipation from each of electronic components 112 to ground contact 114. During the operation of TSSC electronic circuit 100, ground contact 114 is connected to a common ground, such as an aircraft fuselage.

Conductive Polymer Examples

Figure 2A:
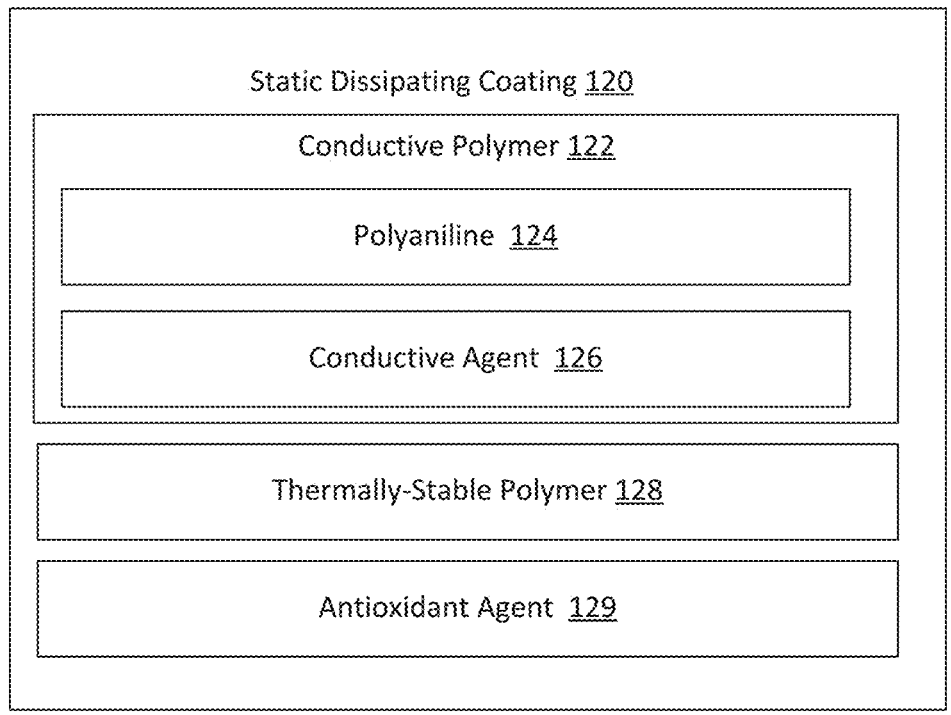
FIG. 2A is a block diagram illustrating the composition of a static dissipating coating, in accordance with some examples.

Referring to FIG. 2A, in some examples, static dissipating coating 120 comprises conductive polymer 122 and thermally-stable base polymer 128. The concentration of conductive polymer 122 in static dissipating coating 120 is a non-zero percentage of at or less than 25% by weight or, more specifically, less than 20% by weight or even less than 15% by weight. The rest of the weight represents thermally-stable base polymer 128. A higher concentration of conductive polymer 122 increases the conductivity of static dissipating coating 120. If this conductivity exceeds the operating range, static dissipating coating 120 can cause electrical shorts. In some examples, the concentration of conductive polymer 122 in static dissipating coating 120 is between 5% by weight and 20% by weight such as between 7% by weight and 18% by weight or even 10% by weight and 15% by weight.

In some examples, conductive polymer 122 comprises polyaniline 124. Other examples include polyethylene dioxythiophene (PEDOT). However, PEDOT uses other solvents (other than cymene), such as esters, ketones, or glycol ethers to facilitate solubility of both the PEDOT and PBM in the same solvent. In more specific examples, conductive polymer 122 further comprises conductive agent 126, such as dinonylnaphthalene sulfonic acid (DNNSA), dodecyl benzene sulfonic acid (DBSA), camphor sulfonic acid (CSA), and combinations thereof. For example, conductive agent 126 is DNNSA.

Thermally-Stable Base Polymer Examples

Figure 2B:
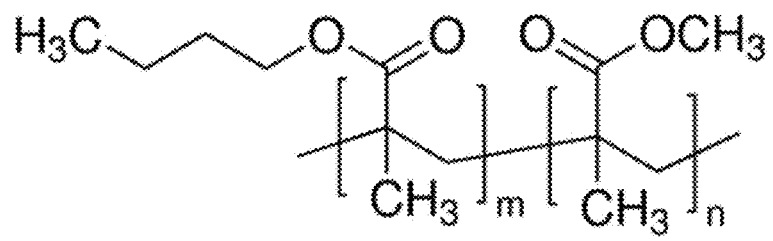
FIG. 2B is a molecular structure of polybutylmethacrylate-co-methyl methacrylate (PBM).

Thermally-stable base polymer 128 comprises one or more copolymers of butyl-methacrylate. In some examples, one or polymers comprise poly-butylmethacrylate-co-methyl methacrylate (PBM), e.g., a PBM with a molecular weight (MW) of between about 50,000 and 500,000 or, more specifically, between about 100,000 and 200,000 such as about 150,000. The molecular structure of PBM is presented in FIG. 2B. Other examples of thermally-stable base polymer 128 include, but are not limited to, polyvinylpyrrolidone (PVP), polyvinylpyrrolidone-vinyl acetate (PVP-VA), polyvinyl caprolactam-covinylacetate-ethylene glycol, hydroxypropyl cellulose (HPC), hydroxypropylmethyl cellulose (HPMC), hydroxypropyl methyl cellulose acetate succinate (HPMCAS), polyethylene oxide (PEO), polybutyl methacrylate-co-2-demethylamino ethyl-methacrylate-co-methyl methacrylate, polyethyl acrylate-co-methyl methacrylate-co-trimethylammonio ethyl methacrylate chloride, polymethacrylic acid-co-methyl methacrylate, polyethyl acrylate-co-methyl methacrylate-co-trimethylammonioethylmethacrylate chloride, poly(e-caprolactone) (PCLa), ethylcellulose polyvinyl alcohol-polyethylene glycol graft copolymer (PVA-PEG)

Static Dissipating Coating Examples

In some examples, static dissipating coating 120 is substantially free from any metal-based structures and any carbon-based structures. For example, the concentration of any non-polymer materials (e.g., metals, carbon structures) in static dissipating coating 120 is less than 1% by weight or less than 0.5% by weight. This feature distinguishes static dissipating coating 120 from the conventional conductive coating, which relies on conductive particles for electrical conductivity. In some examples, static dissipating coating 120 further comprises antioxidant agent 129.

In some examples, conductive polymer 122 and thermally-stable base polymer 128 are both soluble in one or more aromatic solvents. Some examples of such solvents include, but are not limited to, toluene, xylene, cymene, and mixtures thereof. This feature of being able to dissolve in the same solvents allows preparing an ink comprising conductive polymer 122 and thermally-stable base polymer 128 and coat this ink over base structure 110 as further described below.

Static dissipating coating 120 conformally covers base structure 110 and each of electronic components 112 as, e.g., is schematically shown in FIG. 1. In some examples, the average thickness of static dissipating coating 120 is between 0.01 micrometers and 75 micrometers or, more specifically, between 0.1 micrometers and 10 micrometers, such as between 0.5 micrometers and 5 micrometers. Smaller thicknesses provide insufficient encapsulation, static dissipation, and overall coverage. On the other hand, larger thicknesses increase the overall circuit weight and can even cause electrical shorts due to excessive conductivity. In some examples, the thickness variation of static dissipating coating 120 is a non-zero number of less than about 25% or, more specifically, less than about 20%, such as from about 0.01% to about 10% or, more specifically, from about 0.1% to about 5%.

In some examples, the conductivity of static dissipating coating 120 is between $10^{-11}$ S/cm and $10^{-5}$ S/cm or, more specifically, between $10^{-9}$ S/cm and $10^{-6}$ S/cm such as between $10^{-8}$ S/cm and $10^{-7}$ S/cm. These conductivity ranges ensure the static dissipation of static dissipating coating 120 while preventing electrical shorts between electronic components 112. In some examples, the conductivity of static dissipating coating 120 is substantially uniform. For example, the conductivity of static dissipating coating 120 varies less than 100 times through the entire volume of static dissipating coating 120 or even varies less than 10 times. Similar to the conductivity ranges described above, this conductivity uniformity ensures static dissipation throughout the entire TSSC electronic circuit 100 while preventing local electrical shorts.

In some examples, the resistance of static dissipating coating 120 changes between about 1.5 times and 100 times when subjected to 150° C. for 24 hours or, more specifically, between about 2 times and 50 times such as between about 3 times and 10 times. In some examples, the resistance of static dissipating coating 120 changes less than about 100 times when subjected to 150° C. for 24 hours or, more specifically, less than about 50 times or even less than about 10 times. This thermal stability provides that the static dissipating coating 120 can be operated up to 150° C.

In some examples, static dissipating coating 120 is transparent. For purposes of this disclosure, the transparency of static dissipating coating 120 is defined as the ability to see electronic components 112 and other features on the surface of base structure 110 through static dissipating coating 120. For example, the transmittance of static dissipating coating 120 (within the visible light spectrum) is at least about 50% or, more specifically, at least about 70% or even at least about 90%. The transparency of static dissipating coating 120 allows inspection of TSSC electronic circuit 100 after placing static dissipating coating 120, such as light-emitting diodes (LEDs), optical sensors, and other like devices.

Examples of Methods of Forming TSSC Electronic Circuits

Figure 3:
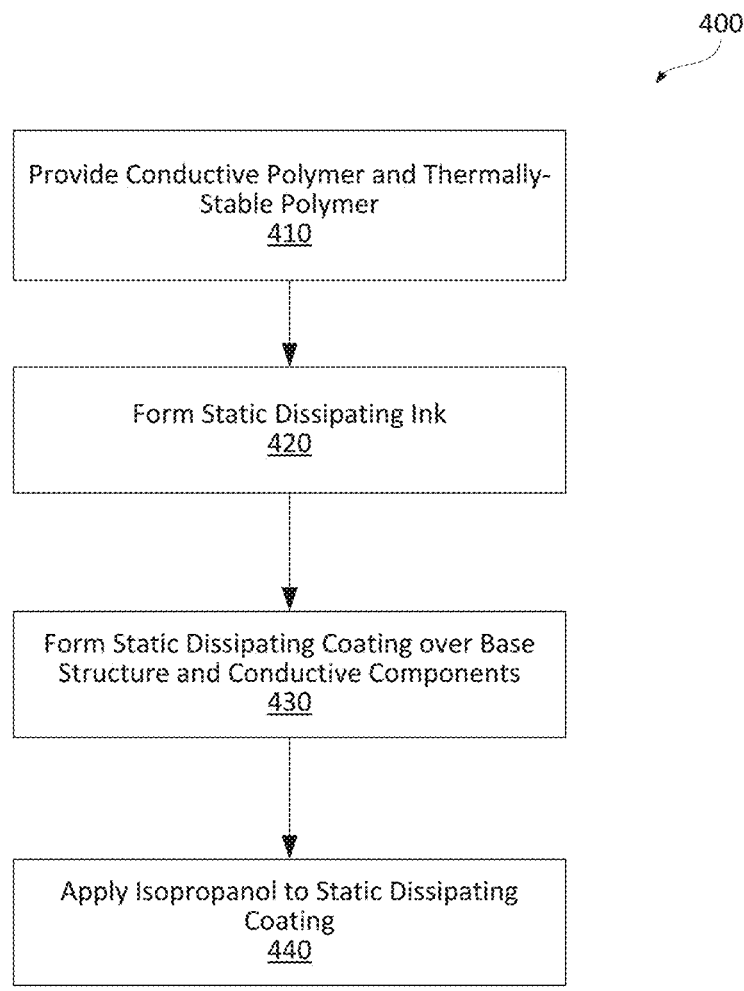
FIG. 3 is a process flowchart corresponding to a method of forming a TSSC electronic circuit, in accordance with some examples.

FIG. 3 is a process flowchart corresponding to method 400 of forming TSSC electronic circuit 100, in accordance with some examples. Various examples and features of TSSC electronic circuit 100 are described above with reference to FIGS. 1 and 2.

In some examples, method 400 comprises (block 410) providing conductive polymer 122 and thermally-stable base polymer 128. Conductive polymer 122 comprises one or more polyanilines 124. Thermally-stable base polymer 128 comprises one or more copolymers of butyl-methacrylate.

In some examples, at least one of conductive polymer 122 or thermally-stable base polymer 128 is provided as a polymer solution in a base solvent. For example, conductive polymer 122 is provided as a solution in toluene. The base solvent forms a portion of static dissipating ink 130, described below. In some examples, the base solvent has the same composition as solvent 132 used to form static dissipating ink 130. Alternatively, the base solvent and solvent 132 have different compositions.

Figure 4A:
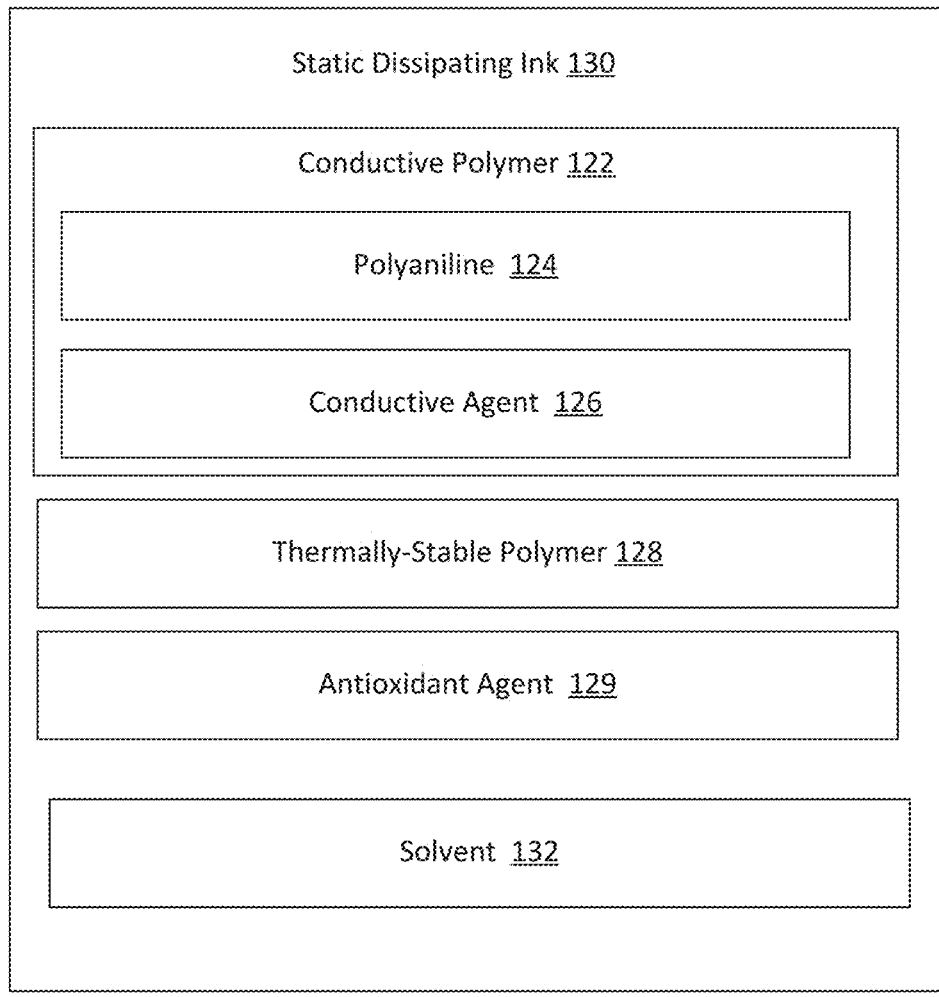
FIG. 4A is a block diagram illustrating the composition of a static dissipating ink, in accordance with some examples.
Figure 4B:
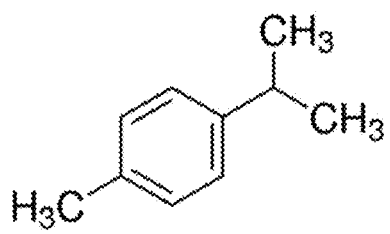
FIG. 4B is a molecular structure of cymene.

In some examples, method 400 proceeds with (block 420) forming static dissipating ink 130 using solvent 132, conductive polymer 122, and thermally-stable base polymer 128. The composition of static dissipating ink 130 is schematically shown in FIG. 4A. In general, static dissipating ink 130 has the same composition as static dissipating coating 120 but also comprises one or more solvents. In some examples, solvent 132 is one or more aromatic solvents. Some examples of suitable solvents include but are not limited to toluene, xylene, cymene, and mixtures thereof. For example, FIG. 4B illustrates the molecular structure of cymene. In some examples, the viscosity of static dissipating ink 130 is between about 10 cPs and 1,000 cPs such as between about 50 cPs and 500 cPs, which is suitable for spraying, brushing, or roll coating.

In some examples, method 400 proceeds with (block 430) forming static dissipating coating 120 using static dissipating ink 130. Specifically, static dissipating coating 120 is formed over base structure 110 with electronic components 112 disposed on and supported by base structure 110. Static dissipating coating 120 conformally covers base structure 110 and each of electronic components 112 as described above with reference to FIG. 2A.

In some examples, forming static dissipating coating 120 comprises one or more of dip-coating, spray-coating, or 3-D printing. Other coating techniques are also within the scope.

In some examples, forming static dissipating coating 120 comprises removing solvent 132 from a layer formed using static dissipating ink 130. In other words, static dissipating ink 130, deposited onto base structure 110, is dried to form static dissipating coating 120. For example, drying is performed at room temperature (e.g., 20-25° C.) for 72 hours followed by drying at 70° C. for 24 hours.

In some examples, method 400 further comprises (block 440) applying isopropanol to static dissipating coating 120 to modify the resistance of static dissipating coating 120.

Experimental Results

Various samples of static dissipating coatings were tested for thermal stability, e.g., resistance changes while being exposed to 150° C. All samples used a polyaniline-based conductive polymer, which was combined with different base polymers. The polyaniline-based conductive polymer was provided as a 50% solution in toluene, such as BM1720 available from Boron Molecular in Raleigh, N.C. Control samples used polyurethane, in combination with the polyaniline-based conductive polymer. Test samples used different amounts of PBM, also in combination with the polyaniline-based conductive polymer. Before combining with the polyaniline-based conductive polymer, PBM was dissolved in cymene at room temperature.

Both control and test inks were drop-cast onto a surface insulation resistance (SIR) test board, having a set of interdigitated contacts. These SIR test boards are specially configured to measure the resistance of coated layers. Each coated layer was dried at room temperature (e.g., 20-25° C.) for 72 hours followed by drying at 70° C. for 24 hours. The coated boards were then placed in a convection oven maintained at 150° C. and the electrical resistance of each board measured was periodically measured. Specifically, the electrical resistance of the circuit was measured using a Keithley 4200 Semiconductor Characterization System (available from Tektronix, Inc. in Beaverton, Oreg.) performing voltage (V) scans from +10 V to −10V and measuring the current (I) during each scan. The resistance was then calculated from the slope of the I-V profile. The results of this test are presented in FIGS. 5 and 6.

Figure 5:
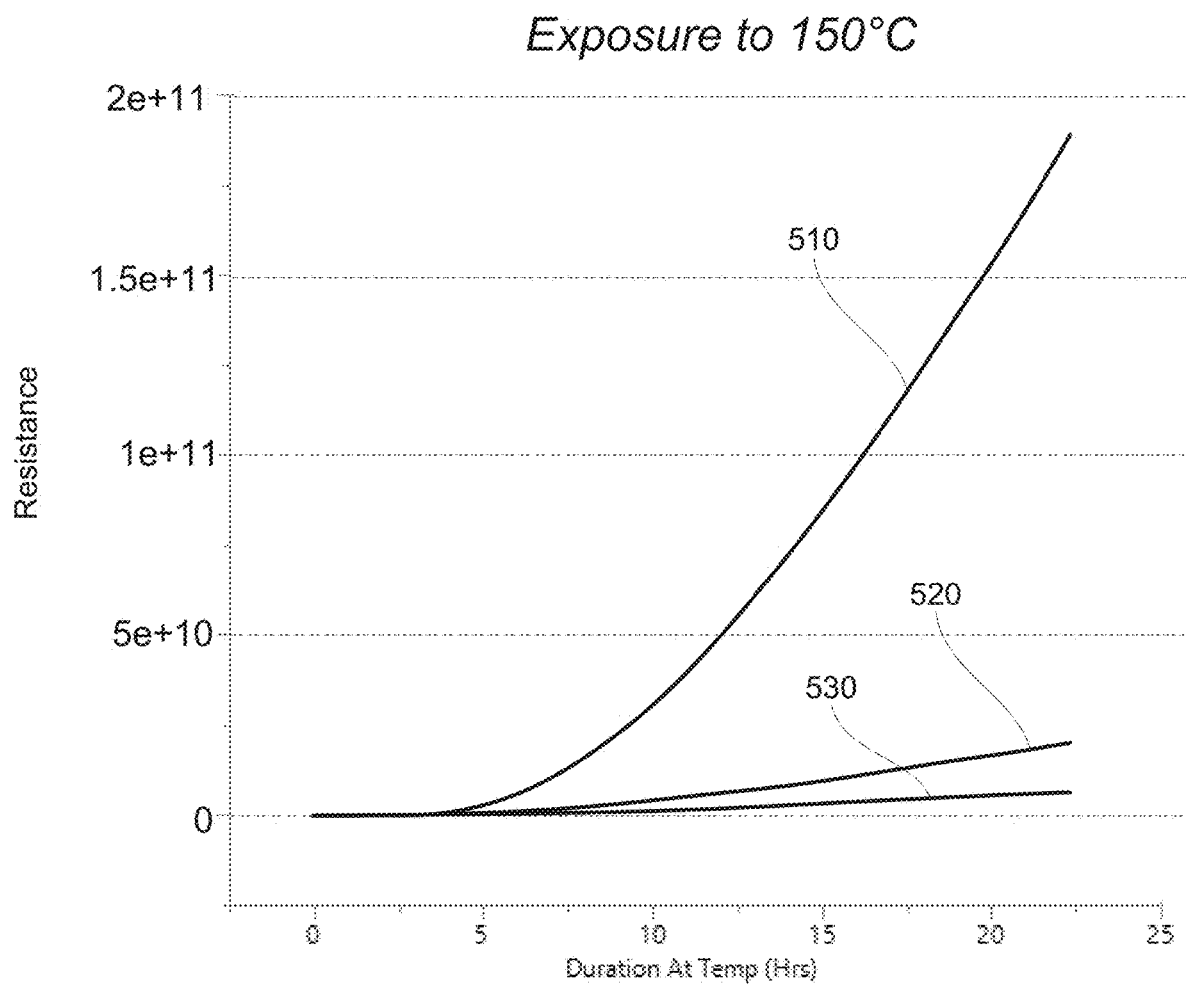
FIGS. 5 and 6 illustrate resistance plots of different static dissipating coatings as a function of 150° C. exposure.

Specifically, FIG. 5 illustrates line 510 corresponding to a control sample formed with 5% by weight of polyurethane, line 520 corresponding to a test sample formed with 16% by weight of PBM, and line 530 corresponding to another test sample formed with 28% by weight of PBM. The 28%-PBM test sample showed the best thermal stability.

Figure 6:
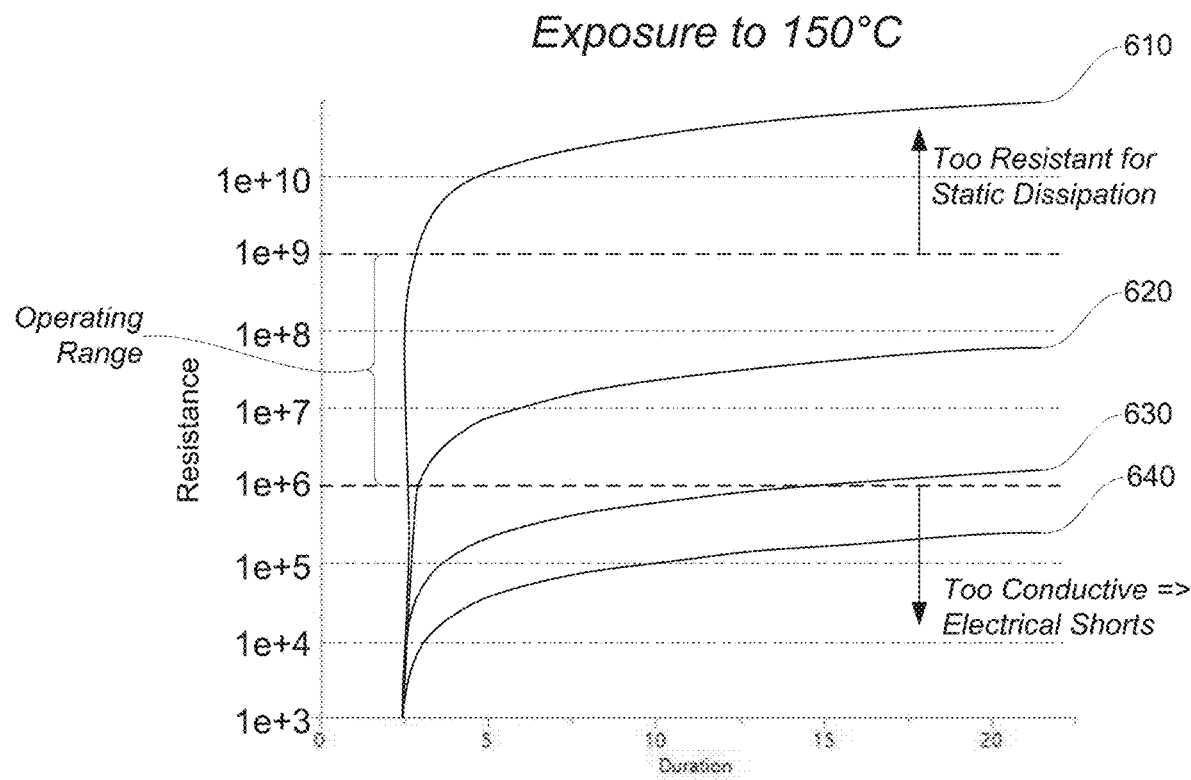

FIG. 6 illustrates the results for different amounts of the polyaniline-based conductive polymer. Resistance values were obtained after 1.25 hours, 2.57 hours, 4.57 hours, and 20.57 hours of thermal exposure at 150° C. in the convection oven. Specifically, line 610 corresponds to a test sample formed with 5% by weight of the polyaniline-based conductive polymer, line 620 corresponds to a test sample formed with 9% by weight of the polyaniline-based conductive polymer, line 630 corresponds to a test sample formed with 50% by weight of the polyaniline-based conductive polymer, and finally line 640 corresponds to a test sample formed with 51% by weight of the polyaniline-based conductive polymer. Only samples with 9% by weight and 50% by weight of the polyaniline-based conductive polymer are within the resistance operating range, which is between 1e+6 and 1e+9. The sample with a smaller amount of the polyaniline-based conductive polymer (i.e., line 610) has a higher resistance than the operating range, while the sample with a higher amount of the polyaniline-based conductive polymer (i.e., line 640) has a lower resistance than the operating range.

Aircraft Examples

In some examples, methods, and systems described above are used on aircraft and, more generally, by the aerospace industry. Specifically, these methods and systems can be used during the fabrication of aircraft as well as during aircraft service and maintenance.

Figure 7:
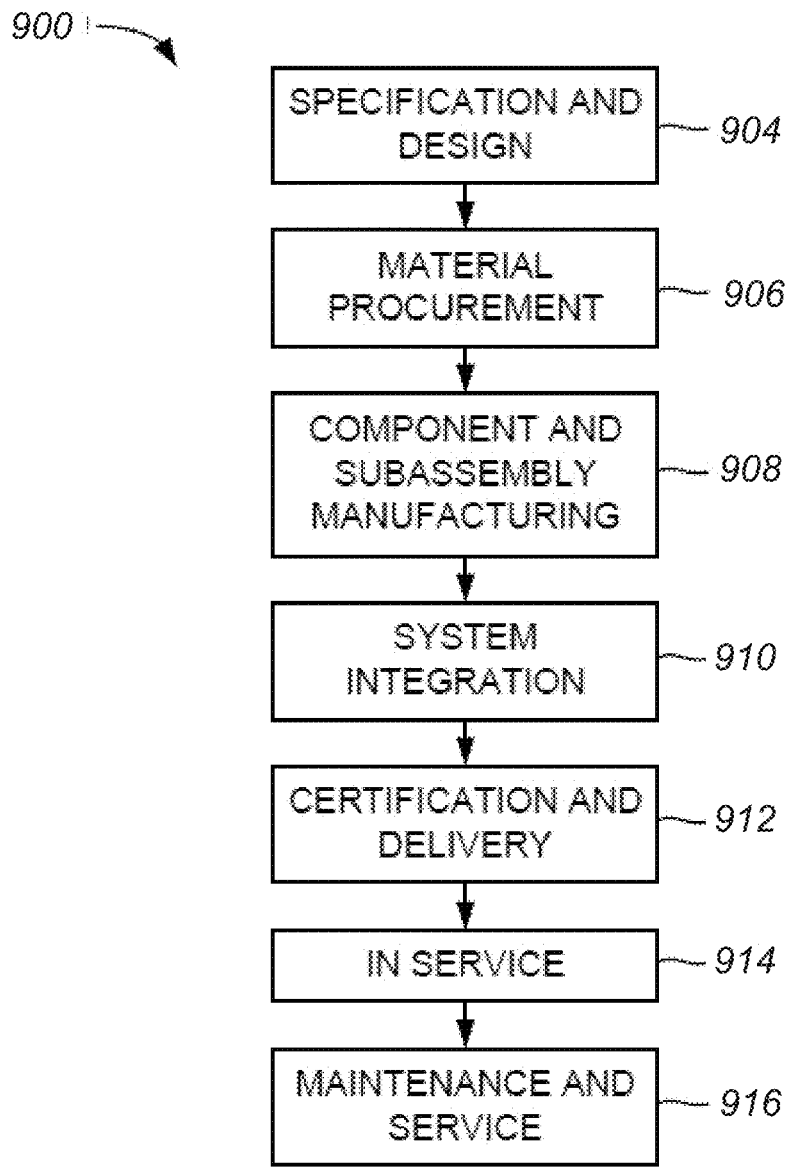
FIG. 7 is a process flowchart corresponding to a method for manufacturing and servicing the aircraft.
Figure 8:
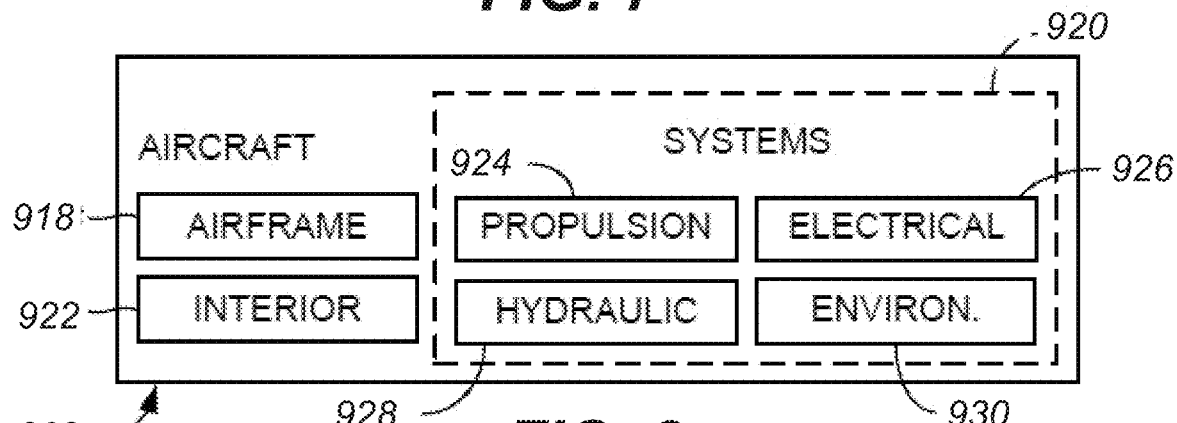
FIG. 8 illustrates a block diagram of an example aircraft, in accordance with some examples.

Accordingly, the apparatus and methods described above are applicable for aircraft manufacturing and service method 900 as shown in FIG. 7 and for aircraft 902 as shown in FIG. 8. During pre-production, method 900 includes specification and design 904 of aircraft 902 and material procurement 906. During production, component, and subassembly manufacturing 908 and system integration 910 of aircraft 902 takes place. Thereafter, aircraft 902 goes through certification and delivery 912 to be placed in service 914. While in service by a customer, aircraft 902 is scheduled for routine maintenance and service 916, which also includes modification, reconfiguration, refurbishment, and so on.

In some examples, each of the processes of method 900 is performed or carried out by a system integrator, a third party, and/or an operator, e.g., a customer. For this description, a system integrator includes without limitation any number of aircraft manufacturers and major-system subcontractors; a third party includes without limitation any number of vendors, subcontractors, and suppliers; and an operator can be an airline, leasing company, military entity, service organization, and so on.

As shown in FIG. 8, aircraft 902 produced by method 900 includes airframe 918 with plurality of systems 920 and interior 922. The airframe 918 includes the wings of the aircraft 902. Examples of systems 920 include one or more of propulsion system 924, electrical system 926, hydraulic system 928, and environmental system 930. Any number of other systems can be included.

Apparatus and methods presented herein can be employed during any one or more of the stages of method 900. For example, components or subassemblies corresponding to manufacturing 908 are fabricated or manufactured in a manner similar to components or subassemblies produced while aircraft 902 is in service. Also, one or more apparatus examples, method examples, or a combination thereof are utilized during manufacturing 908 and system integration 910, for example, by substantially expediting assembly of or reducing the cost of an aircraft 902. Similarly, one or more apparatus examples, method examples, or a combination thereof are utilized while aircraft 902 is in service, for example, and without limitation, to maintenance and service 916.

Further Examples

Further, the description includes examples according to the following clauses:

Clause 1. A thermally-stable static-controlled electronic circuit comprising:
  a base structure;
  electronic components, disposed on and supported by the base structure; and a static dissipating coating, conformally covering the base structure and each of the electronic components, wherein:
the static dissipating coating comprises a conductive polymer and a thermally-stable base polymer,
the conductive polymer comprises polyaniline,
the thermally-stable base polymer comprises one or more copolymers of butyl-methacrylate.

Clause 2. The thermally-stable static-controlled electronic circuit of clause 1, wherein the conductive polymer further comprises a conductive agent, selected from the group consisting of dinonylnaphthalene sulfonic acid (DNNSA), dodecyl benzene sulfonic acid (DBSA), camphor sulfonic acid (CSA), and combinations thereof.

Clause 3. The thermally-stable static-controlled electronic circuit of clause 2, wherein the conductive agent is dinonylnaphthalene sulfonic acid (DNNSA).

Clause 4. The thermally-stable static-controlled electronic circuit of any one of clauses 1-3, wherein the one or more copolymers of butyl-methacrylate in the thermally-stable base polymer comprise poly-butylmethacrylate-co-methyl methacrylate (PBM).

Clause 5. The thermally-stable static-controlled electronic circuit of any one of clauses 1-4, wherein a concentration of the conductive polymer in the static dissipating coating is at or less than 25% by weight.

Clause 6. The thermally-stable static-controlled electronic circuit of clause 5, wherein the concentration of the conductive polymer in the static dissipating coating is between 5% by weight and 20% by weight.

Clause 7. The thermally-stable static-controlled electronic circuit of any one of clauses 1-6, wherein conductivity of the static dissipating coating is between $10^{-9}$ S/cm and $10^{-6}$ S/cm.

Clause 8. The thermally-stable static-controlled electronic circuit of any one of clauses 1-7, wherein conductivity of the static dissipating coating varies less than 100 times through an entire volume of the static dissipating coating.

Clause 9. The thermally-stable static-controlled electronic circuit of any one of clauses 1-8, wherein conductivity of the static dissipating coating varies less than 10 times through an entire volume of the static dissipating coating.

Clause 10. The thermally-stable static-controlled electronic circuit of any one of clauses 1-9, wherein the static dissipating coating is transparent.

Clause 11. The thermally-stable static-controlled electronic circuit of any one of clauses 1-10, wherein the static dissipating coating is substantially free from any metal-based structures and from any carbon-based structures.

Clause 12. The thermally-stable static-controlled electronic circuit of any one of clause 1-11, wherein the conductive polymer and the thermally-stable base polymer are both soluble in one or more aromatic solvents.

Clause 13. The thermally-stable static-controlled electronic circuit of clause 12, wherein the one or more aromatic solvents are selected from the group consisting of toluene, xylene, cymene, and mixtures thereof.

Clause 14. The thermally-stable static-controlled electronic circuit of any one of clauses 1-13, wherein the static dissipating coating further comprises an antioxidant agent.

Clause 15. The thermally-stable static-controlled electronic circuit of any one of clauses 1-14, further comprising a ground contact, disposed on and supported by the base structure, wherein the ground contact is electrically insulated from the electronic components, and wherein the static dissipating coating conformally covers the ground contact and provides the static dissipation from each of the electronic components to the ground contact.

Clause 16. The thermally-stable static-controlled electronic circuit of any one of clauses 1-15, wherein the base structure is one of a printed circuit board or a flexible circuit.

Clause 17. The thermally-stable static-controlled electronic circuit of any one of clauses 1-16, wherein the static dissipating coating provides static dissipation to the electronic components while preventing electrical shorts between the electronic components.

Clause 18. The thermally-stable static-controlled electronic circuit of any one of clauses 1-17, wherein a resistance of the static dissipating coating changes less than 100 times when subjected to 150° C. for 24 hours.

Clause 19. The thermally-stable static-controlled electronic circuit of any one of clauses 1-18, wherein a resistance of the static dissipating coating changes less than 10 times when subjected to 150° C. for 24 hours.

Clause 20. The thermally-stable static-controlled electronic circuit of any one of clauses 1-19, wherein the static dissipating coating has a thickness of between 0.1 micrometers and 10 micrometers.

Clause 21. A static dissipating coating for conformal coating over electronic components, the static dissipating coating comprising:
a conductive polymer, comprising polyaniline; and
a thermally-stable base polymer, comprising one or more copolymers of butyl-methacrylate.

Clause 22. The static dissipating coating of clause 21, wherein the conductive polymer further comprises a conductive agent, selected from the group consisting of dinonylnaphthalene sulfonic acid (DNNSA), dodecyl benzene sulfonic acid (DBSA), camphor sulfonic acid (CSA), and combinations thereof.

Clause 23. The static dissipating coating of clause 22, wherein the conductive agent is dinonylnaphthalene sulfonic acid (DNNSA).

Clause 24. The static dissipating coating of any one of clauses 21-23, wherein the one or more copolymers of butyl-methacrylate in the thermally-stable base polymer comprise poly-butylmethacrylate-co-methyl methacrylate (PBM).

Clause 25. The static dissipating coating of any one of clauses 21-24, wherein a concentration of the conductive polymer in the static dissipating coating is at or less than 25% by weight.

Clause 26. The static dissipating coating of any one of clauses 21-25, wherein a conductivity of the static dissipating coating is between $10^{-9}$ S/cm and $10^{-6}$ S/cm.

Clause 27. The static dissipating coating of any one of clauses 21-26, wherein a conductivity of the static dissipating coating varies less than 100 times through an entire volume of the static dissipating coating.

Clause 28. The static dissipating coating of any one of clauses 21-27, wherein the static dissipating coating is transparent.

Clause 29. The static dissipating coating of any one of clauses 21-29, wherein the static dissipating coating is substantially free from any metal-based structures and from any carbon-based structures.

Clause 30. The static dissipating coating of any one of clauses 21-29, wherein a resistance of the static dissipating coating changes less 100 times when subjected to 150° C. for 24 hours.

Clause 31. A method of forming a thermally-stable static-controlled electronic circuit, the method comprising:

providing a conductive polymer and a thermally-stable base polymer, wherein the conductive polymer comprises one or more polyanilines, wherein and the thermally-stable base polymer comprises one or more copolymers of butyl-methacrylate;

forming a static dissipating ink using a solvent, the conductive polymer, and the thermally-stable base polymer; and forming a static dissipating coating using the static dissipating ink, the static dissipating coating is formed over a base structure with electronic components disposed on and supported by the base structure such that the static dissipating coating conformally covers the base structure and each of the electronic components and providing static dissipation to the electronic components while preventing electrical shorts among the electronic components.

Clause 32. The method of clause 31, wherein the solvent is one or more aromatic solvents.

Clause 33. The method of clause 32, wherein the one or more aromatic solvents are selected from the group consisting of toluene, xylene, and cymene.

Clause 34. The method of any one of clauses 31-33, wherein forming the static dissipating coating comprises one or more of dip-coating, spray-coating, or 3-D printing.

Clause 35. The method of any one of clauses 31-34, wherein at least one of the conductive polymer or the thermally-stable base polymer is provided as a polymer solution in a base solvent, the base solvent forming a portion of the static dissipating ink.

Clause 36. The method of any one of clause 31-35, wherein forming the static dissipating coating comprises removing the solvent from a layer formed using the static dissipating ink.

Clause 37. The method of any one of clauses 31-36, further comprising applying isopropanol to the static dissipating coating to modify resistance of the static dissipating coating.

Clause 38. The method of any one of clauses 31-37, wherein the static dissipating ink has a viscosity of between about 10 cPs and 1,000 cPs.

CONCLUSION

Although the foregoing concepts have been described in some detail for purposes of clarity of understanding, it will be apparent that certain changes and modifications may be practiced within the scope of the appended clauses. It should be noted that there are many alternative ways of implementing the processes, systems, and apparatus. Accordingly, the present examples are to be considered as illustrative and not restrictive.

What is claimed is:

1. A thermally-stable static-controlled electronic circuit comprising:
a base structure;
electronic components, disposed on and supported by the base structure; and
a static dissipating coating, conformally covering the base structure and each of the electronic components, wherein:
the static dissipating coating comprises a conductive polymer and a thermally-stable base polymer,
the conductive polymer comprises polyaniline and a conductive agent, selected from the group consisting of dinonylnaphthalene sulfonic acid (DNNSA), dodecyl benzene sulfonic acid (DBSA), camphor sulfonic acid (CSA), and combinations thereof,
the thermally-stable base polymer comprises one or more copolymers of butyl-methacrylate, and
wherein the conductive polymer and the thermally-stable base polymer are both soluble in cymene.

2. The thermally-stable static-controlled electronic circuit of claim 1, wherein the conductive agent is dinonylnaphthalene sulfonic acid (DNNSA).

3. The thermally-stable static-controlled electronic circuit of claim 1, wherein the one or more copolymers of butyl-methacrylate in the thermally-stable base polymer comprise poly-butylmethacrylate-co-methyl methacrylate (PBM).

4. The thermally-stable static-controlled electronic circuit of claim 1, wherein a concentration of the conductive polymer in the static dissipating coating is at or less than 25% by weight.

5. The thermally-stable static-controlled electronic circuit of claim 4, wherein the concentration of the conductive polymer in the static dissipating coating is between 5% by weight and 20% by weight.

6. The thermally-stable static-controlled electronic circuit of claim 1, wherein a conductivity of the static dissipating coating is between $10^{-9}$ S/cm and $10^{-6}$ S/cm.

7. The thermally-stable static-controlled electronic circuit of claim 1, wherein a conductivity of the static dissipating coating varies less than 100 times through an entire volume of the static dissipating coating.

8. The thermally-stable static-controlled electronic circuit of claim 1, wherein a conductivity of the static dissipating coating varies less than 10 times through an entire volume of the static dissipating coating.

9. The thermally-stable static-controlled electronic circuit of claim 1, wherein the static dissipating coating is transparent.

10. The thermally-stable static-controlled electronic circuit of claim 1, wherein the static dissipating coating is substantially free from any metal-based structures and from any carbon-based structures.

11. The thermally-stable static-controlled electronic circuit of claim 1, wherein the static dissipating coating further comprises an antioxidant agent.

12. The thermally-stable static-controlled electronic circuit of claim 1, further comprising a ground contact, disposed on and supported by the base structure, wherein the ground contact is electrically insulated from the electronic components, and wherein the static dissipating coating conformally covers the ground contact and provides the static dissipation from each of the electronic components to the ground contact.

13. The thermally-stable static-controlled electronic circuit of claim 1, wherein the base structure is one of a printed circuit board or a flexible circuit.

14. The thermally-stable static-controlled electronic circuit of claim 1, wherein the static dissipating coating provides static dissipation to the electronic components while preventing electrical shorts between the electronic components.

15. The thermally-stable static-controlled electronic circuit of claim 1, wherein resistance of the static dissipating coating changes less than 100 times when subjected to 150° C. for 24 hours.

16. The thermally-stable static-controlled electronic circuit of claim 1, wherein a conductivity of the static dissipating coating varies less than 100 times through an entire volume of the static dissipating coating.

17. A static dissipating coating for conformal coating over electronic components, the static dissipating coating comprising:
- a conductive polymer, comprising polyaniline and a conductive agent, selected from the group consisting of dinonylnaphthalene sulfonic acid (DNNSA), dodecyl benzene sulfonic acid (DBSA), camphor sulfonic acid (CSA), and combinations thereof; and
- a thermally-stable base polymer, comprising one or more copolymers of butyl methacrylate, and
- wherein the conductive polymer and the thermally-stable base polymer are both soluble in cymene.

18. A method of forming a thermally-stable static-controlled electronic circuit, the method comprising:
- providing a conductive polymer and a thermally-stable base polymer, wherein the conductive polymer comprises one or more polyanilines and a conductive agent, selected from the group consisting of dinonylnaphthalene sulfonic acid (DNNSA), dodecyl benzene sulfonic acid (DBSA), camphor sulfonic acid (CSA), and combinations thereof, wherein and the thermally-stable base polymer comprises one or more copolymers of butyl-methacrylate;
- forming a static dissipating ink using a solvent, the conductive polymer, and the thermally-stable base polymer, wherein the conductive polymer and the thermally-stable base polymer are both soluble in cymene; and
- forming a static dissipating coating using the static dissipating ink, the static dissipating coating is formed over a base structure with electronic components disposed on and supported by the base structure such that the static dissipating coating conformally covers the base structure and each of the electronic components and providing static dissipation to the electronic components while preventing electrical shorts among the electronic components.

19. The method according to claim 18, wherein forming the static dissipating coating comprises one or more of dip-coating, spray-coating, or 3-D printing.

20. The method according to claim 18, wherein at least one of the conductive polymer or the thermally-stable base polymer is provided as a polymer solution in a base solvent, the base solvent forming a portion of the static dissipating ink.

* * * * *